Jan. 14, 1958 V. P. MATHIS ET AL 2,820,152
SEMI-CONDUCTOR NETWORK
Filed June 15, 1954

INVENTOR:
VERNON P. MATHIS,
JEROME J. SURAN,
BY George V. Eltgroth
THEIR ATTORNEY.

2,820,152

SEMI-CONDUCTOR NETWORK

Vernon P. Mathis and Jerome J. Suran, Syracuse, N. Y., assignors to General Electric Company, a corporation of New York Application June 15, 1954, Serial No. 436,970

3 Claims. (Cl. 307—88.5)

This invention relates to networks which are discontinuously responsive to applied signals, and more particularly to improved networks of this class utilizing semi-conductors.

While networks exhibiting more than one degree of electrical stability and networks whose operating cycles are initiated, but not controlled by, applied signals, are known, such networks have heretofore consisted of arrays of electric discharge devices characterized by a vacuum or relatively low gas pressure in the electrode volume of have utilized multiple junction semi-conductors.

Accordingly, it is a primary object of this invention to provide new and novel semi-conductor networks of relatively simple structure which exhibit a discontinuity in their response to a control signal.

It is another object of the invention to provide a new and novel bistable electric network characterized by reliable operation with few required components.

A further object of the invention is to provide a new and improved triggered pulse generator.

Still another object of the invention is to provide a new and improved triggering network for a single junction semi-conductor network which is discontinuously responsive to applied signals.

For additional objects and advantages, and for a better understanding of the invention, reference is now made to the following description and accompanying drawings which will make apparent the essence of the invention in several representative examples of its application. The novel features of the invention are more particularly pointed out in the appended claims.

A single junction semi-conductor device of the type here dealt with has been previously described by I. A. Lesk in U. S. patent application, Serial No. 341,164, filed March 9, 1953, and entitled "Non-Linear Resistance Device," and J. M. Engel in U. S. patent application, Serial No. 373,828, filed August 12, 1953, and entitled "Non-Linear Resistance Device," both of said applications being assigned to the same assignee as the assignee of the instant invention.

Further information relative to such devices may be derived from an inspection of U. S. patent application, Serial No. 432,816, filed May 27, 1954, entitled "Semi-conductor Network," on behalf of J. J. Suran and V. P. Mathis and assigned to the same assignee as the assignee of the instant invention.

Figure 1:
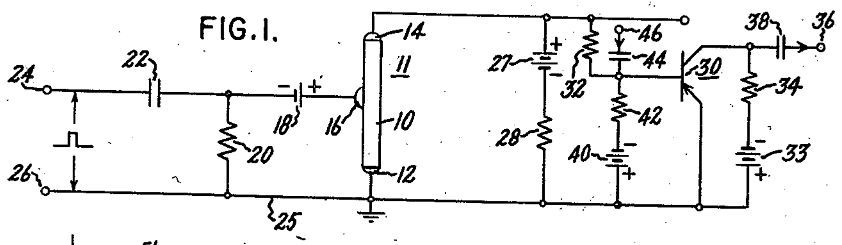
Figure 1 is a schematic diagram of a bistable network according to the invention, driving a signal controlling element.

Referring now to Figure 1, a typical semi-conductor device 11 suitable for use in the networks disclosed herein, is shown as comprising a semi-conducting body 10 which may be of N-type germanium or silicon provided respectively at 12 and 14 with electrodes having the property of conducting current to and from the bar 10 without introducing appreciable rectifying properties, that is, they are predominantly bilateral in their conductive action. Sprayed tin electrodes satisfactorily perform the services of affording such a bilateral contact. A rectifying junction 16 is established on the bar intermediate the bilaterally conductive electrodes, through the usual application of an acceptor type of impurity such as indium. For this purpose, any of the well-known techniques for diffusing the acceptor or P-type impurity into the bar may be used, in conjunction with such forming process and mechanical structure as is needed to provide a reliable contact for junction 16 which has suitable unilateral characteristics. While a semi-conductor device consisting of a P-type junction on an N-type bar has been described, it will be obvious to those skilled in the art that the principles of the invention on a P-type bar, providing only that the polarities of the exciting sources be readjusted according to the well-known rules.

A source of potential 18, which may have a potential of about 1.5 volts is connected with its positive terminal linked to the junction electrode 16, and its negative terminal connected with the bilaterally conductive electrode 12 through a resistor 20 which may be about 240 ohms.

The junction electrode end of the resistor 20 is connected through a capacitor 22, which may have a value of one microfarad, with trigger input terminal 24. The base electrode 12 of the semi-conductor device 11 is connected with ground, and the other input terminal 26 is joined to the ground line 25.

The other base electrode 14 is connected through a potential source 27 and resistance 28 with the base electrode 12. The source 27 may have a potential of 22.5 volts, while the resistor 28 may have a value of 5,100 ohms. The source 27 is so poled as to maintain the base electrode 14 positive with respect to the base electrode 12.

The double-base diode circuit just described, may be used to control a further network including a P–N–P transistor indicated at 30 and having its base electrode connected with the diode base electrode 14 via resistor 32, which may be about 12,000 ohms.

The emitter of the transistor 30 is connected with ground, while its collector is excited from the source 33 and resistor 34 connected in series between ground and the collector. The source 33 may have a potential of 22.5 volts, while the resistor 34 may have a value of 5,500 ohms. Output signals from the collector circuit are fed to an output terminal 36 through coupling capacitor 38, which may have a value of one microfarad. The poling of the source 33 is such as to maintain the collector of transistor 30 negative with respect to ground.

A potential source 40, which may have a value of nine volts, is connected with positive terminal grounded and its negative terminal connected through the resistor 42 with the base of transistor 30. Resistor 42 may have a value of 18,000 ohms. A capacitor 44 links the junction of resistors 32 and 42 with a terminal 46 to which signals from any desired source may be applied. Capacitor 44 is proportioned to pass the signal from terminal 46 without objectionable attenuation.

Figure 2:
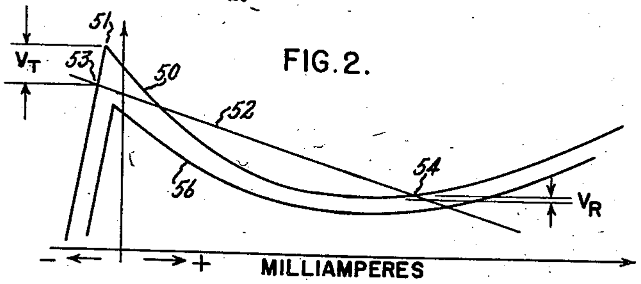
Figure 2 is a graphic illustration of the operating characteristics displayed in the circuit of Figure 1.

The operation of the circuit of Figure 1 may be readily comprehended from the opearting characteristic of Figure 2 in which the curve 50 represents graphically the relationship between the current flow at the junction 16 and the potential between the said junction 16 and the base electrode 12 for a selected interbase voltage. It will be noted that the curve 50 includes a portion of positive slope in the reverse current region reaching a peak at 51. The peak 51 occurs at a small value of reverse current. Thereafter, the curve 50 assumes a negative slope extending into the positive current-voltage quadrant, reaching a minimum or valley and then reassuming a positive slope. The curve 56 represents a similar characteristic observed with a lesser interbase voltage. The load line 52, in Figure 2, illustrates the change in potential at the junction 16 due to the combined effects of current flow through the source 18 and resistor 20. The ordinate intercept of load line 52 corresponds to the potential of the source 18 while its slope corresponds to the value of resistor 20. The two stable states of the double-based diode of Figure 1 correspond to the two intersections 53, 54 of the load line 52 with the curve 50 where the latter has a positive slope.

The circuit of Figure 1 assumes one or the other of the stable states corresponding respectively to the intersections 53, 54 under the control of positive-going and negative-going impulses applied to the input terminals 24, 26. Depending upon the sequence in which the sources 18 and 27 are placed in the circuit, the double-based diode network will initially be at operating point 53 or 54. Let it be assumed that the potential of source 27 was first applied, and that the potential of source 18 was subsequently introduced. Under these conditions, the current and voltage conditions in the circuit correspond to the operating point 53. If a positive-going signal now be applied to the trigger input terminal 24 of an amplitude at least equal to $V_t$, the ordinate difference between the peak point 51 and the operating point 53, the network is driven into the negative resistance region and the current-voltage conditions shift to those characterizing the operating point 54. The circuit remains in this condition, even after the termination of the positive-going pulse at input terminal 24.

If now a negative-going impulse be applied to the trigger input terminal 24, of amplitude at least equal to $V_r$ which is the ordinate difference between the operating point 54 and a line tangent to the valley of the curve 50, the polarity of current flow through the junction 16 shifts from positive to negative, and the circuit is returned to operating point 53, where it remains until the appearance of the next positive-going impulse at the trigger input terminal 24.

The double-based diode network of Figure 1 has thus been shown to exhibit bistable characteristics in which the operating state is determined by the polarity of the last-applied trigger pulse. These pulses may be applied at any rate, subject only to the limitations imposed by the time requirement within the body of the semi-conductor for the establishment of new equilibria of carrier conditions.

The positive voltage appearing at the base electrode 14 is relatively high when the network is in the stable state corresponding to intersection 53, and is relatively less positive when the circuit is in the stable state corresponding to the intersection 54. These voltage changes are super-imposed upon the normal operating potentials for the transistor 30 to render the base electrode thereof alternatively positive or negative with respect to ground. While the electrode 14 is at the positive potential limit of its excursion, the base of transistor 30 is maintained at a potential which does not permit the passage of low amplitude signals applied at input terminal 46 to the output terminal 36. Conversely, when the base electrode 14 is at the lower limit of its voltage excursion, voltage conditions exist at the electrodes of transistor 30 which effectively couple input terminal 46 and output terminal 36 through the transistor 30 and associated networks. This arrangement, therefore, provides for convenient gating of the signals from the source connected to the input terminal 46 in response to triggering and reset impulses applied to the terminal 24.

Figure 3:
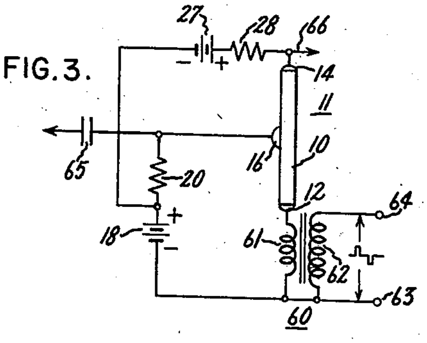
Figure 3 illustrates an alternative arrangement for shifting the state of a bistable network.

Referring now to Figure 3, there is seen another circuit configuration utilizing the properties of a single junction, double-based semi-conductor to develop a bistable network. As before, the semi-conductor device 11 comprises a semi-conducting body 10 to which there are attached bilaterally-conducting electrodes 12 and 14 at either end, with a junction electrode 16 disposed intermediately thereof. The electrode 14 is connected with one terminal of resistor 28, and the other terminal of resistor 28 is linked with the positive terminal of the source 27. The negative pole of the source 27 is, in turn, connected with the positive pole of the source 18, having its negative pole connected through the secondary 61 of the transformer 60 with the base electrode 12. The transformer 60 also includes the primary 62, which may be driven from the trigger input terminals 63, 64. The resistor 20 connects the positive pole of the source 18 with the junction electrode 16. Signals may be derived from the base electrode 14 over the line 66 or, alternatively, from the junction end of resistor 20 through capacitor 65 which may have a value of about one microfarad.

The elements in Figure 3 which bear the same reference characters as corresponding elements in Figure 1 may have substantially the same component values given by way of example in connection with Figure 1. In the event that the characteristics of the secondary winding 61 of transformer 60, such as its resistance and/or inductance, influence the action of this circuit appreciably, appropriate compensatory adjustment may be made in the values of the components referred to.

The mode of operation of Figure 3 is also embraced within the illustration of the operating characteristics depicted by Figure 2. Due, however, to the shift in current-voltage characteristic at the junction electrode with change in interbase voltage a somewhat greater amplitude of trigger impulse may be required in the secondary 61 of the transformer 60. This is compensated for, however, by the advantage in having two largely independent take-off points for the signals developed in the semi-conductor network. Positive and negative-going impulses, respectively, in the secondary 61 of the transformer 60, drive this network alternatively to its high-positive current and low-negative current stable states, corresponding respectively to the intersections 54 and 53 of the load line 52 and current-voltage characteristic 50.

Figure 4:
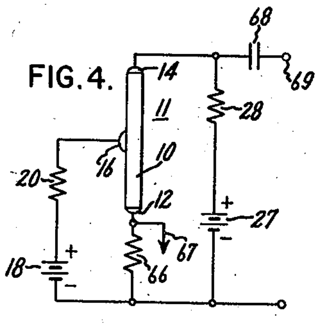
Figure 4 illustrates schematically still another alternative arrangement for shifting the state of a bistable network.

Still another bistable network based on the properties of the single junction, double-based semi-conductor appears in Figure 4 where the semi-conductor device 11 comprising the body 10, bilaterally-conductive electrodes 12, 14 and rectifying junction 16, has the electrode 14 connected with the positive pole of the source 27 through resistor 28. The negative pole of the source 27 is connected with the electrode 12 through a load resistor 66, and an output line 67 is brought out from the junction of load resistor 66 and electrode 12. The negative terminal of the source 27 is also joined with the negative pole of source 18 whose positive pole is connected with the junction electrode 16 through resistor 20. A coupling capacitor 68, of suitable size, connects the trigger input terminal 69 with the electrode end of resistor 28. As in Figure 3, the circuit components identified by the same reference characters as appear in Figure 1 may have representative values substantially the same as the values given in connection with Figure 1. The load resistor 66 is chosen to provide the desired output signal magnitude, consistent with the condition that the operation of the circuit should not be significantly affected. A resistor of less than 75 ohms will operate satisfactorily in the position of resistor 66 in Figure 4.

The network of Figure 4 is triggered from one state to the other by alteration of the interbase voltage and may also be conveniently understood by reference to Figure 2. If the network of Figure 4 is presumed to rest initially at the operating point 53, a negative-going input impulse applied to the terminal 69 changes the operating characteristic of the semi-conductor device 11 to follow the characteristic curve 56 in Figure 2. Since the junction electrode potential is not affected to a major extent by the change in interbase voltage, the operating point now lies above the peak of curve 56 and the current through the resistor 20 increases rapidly until, at the end of the trigger pulse, the network is resting under the stable current-voltage conditions corresponding to operating point 54 in Figure 2. A positive-going impulse applied to the terminal 69 causes the circuit to exhibit an operating characteristic lying above the curve 50 and having no point of intersection in a region of positive slope with the load line 52 which lies to the right of the ordinate axis. Accordingly the current-voltage conditions in the network, at the end of this trigger pulse, will have been transferred to the operating point 53 on the curve 50.

There are many times when it is required that a network respond to a trigger impulse by executing a predetermined cycle of operation which, at its conclusion, leaves the network in its initial condition. Characteristically, such networks involve the use of a storage device, as well as an element which exhibits negative resistance. This network, shown in Fig. 5, also utilizes a semi-conducting device 11 comprising, in this example, an N-type germanium body 10 provided with bilaterally-conducting electrodes 12, 14 between which there is situated the junction electrode 16. The electrode 12 is connected through a switch 71 with the positive pole of a source 70 which may have a potential of nine volts, and the negative pole of the source 70 is connected through resistor 75 which may have a value of 1,000 ohms with the electrode 14. The junction electrode 16 is connected through a switch 73 with a positive pole of a source 72, which may have a value of about three volts. Resistors 74 and 78, which may be respectively 3,900 ohms and 500 ohms, are connected in series between the negative pole of source 72 and the electrode 14. A capacitor 76 which may be about .01 microfarad is connected in shunt with the resistor 74. Terminals 79, 80 connected to either end of resistance 78 provide a convenient path for the introduction of trigger impulses. The customary D. C. isolating capacitor may be included in this portion of the circuit, as, for example, in the lead to terminal 79, if desired. Output signals from the network may be derived from a terminal 81 connected with the junction electrode 16, and, if desired, output signals may also be derived from the voltage changes which occur across the resistance 75.

Figure 6:
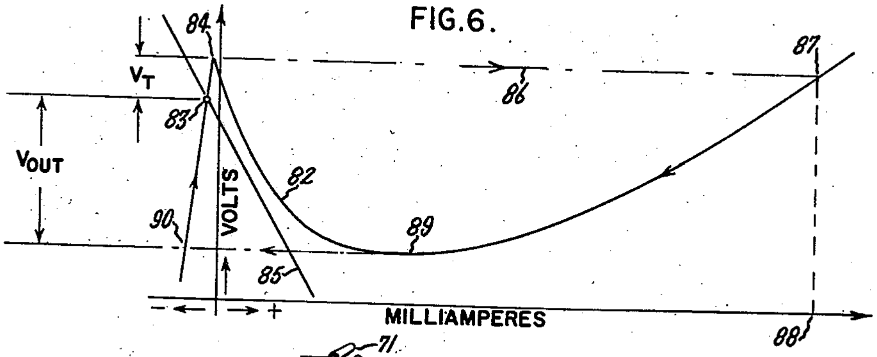
Figure 6 is a graphic illustration of operating characteristics describing the performance of a triggered, single junction semi-conductor network.
Figure 5:
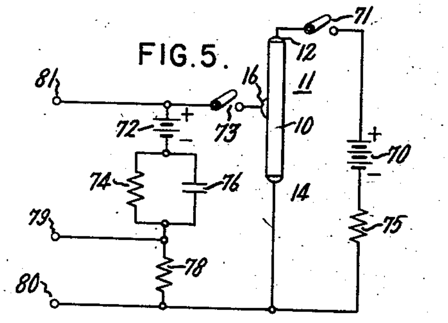
Figure 5 is a schematic illustration of a triggered pulse generator incorporating a single junction semi-conductor device.

A consideration of the current-voltage relationships graphically illustrated in Figure 6, will be of assistance in comprehending the operation of the network in Figure 5. The curve 82 illustrates the now familiar basic relationship between the junction voltage and current in the presence of a constant interbase voltage. This interbase voltage is provided in the operating network by the potential 70 in series with the resistor 75. It will be noted that there exists on the curve 82 a peak 84, to the left of which the characteristic exhibits a positive slope, while to its right there exists a negative slope for an extended range of currents. Also shown in Figure 6 is a load line 85 whose intercept on the ordinate axis is equal to the potential of the source 72, and whose slope corresponds to the sum of resistances 74, 78. The load line 85 intersects the semi-conductor characteristic 82 at the point 83 which represents current and voltage conditions existing in the network with the switches 71, 73 closed and no input signal. When an input signal having a magnitude at least equal to $V_t$, which is the ordinate difference between operating point 83 and the peak 84, is applied, the junction current rises along the line of positive slope from the operating point 83, until it reaches the peak 84, when it increases rapidly along the dashed line 86 to reach its peak value at the intersection 87 of the dynamic operating line 86 with the curve 82. The value of the abscissa 88 resulting from the projection of this intersection on the abscissal axis corresponds to the peak current occurring in the circuit. This current, derived from the capacitor or storage device 76, continues to flow with decreasing amplitude following the operating characteristic 82, with diminishing junction voltage, until the valley indicated generally at 89 is reached, when the current flow rapidly alters, without significant change in junction potential to reach the intersection 90 between the junction current-voltage characteristic and a tangent to the valley 89. Thereafter, the junction potential increases from the intersection 90 to the rest intersection 83 along the positive slope portion of the characteristic curve 82 in the negative-current quadrant. The circuit is now in its initial rest position, ready for the receipt of another trigger impulse. As is apparent from the figure, the minimum required triggering potential is $V_t$, already mentioned, and the observed peak output voltage amplitude is given by $V_{out}$ which corresponds to the difference in ordinate existing at the intersections 83 and 90.

As has been earlier pointed out, the principles of this invention may also be applied with equal benefit to the utilization of N–P semi-conducting devices with the proper alterations in battery potential. The specific component values given have been representative merely and they may be subject to considerable variation in accordance with the specific environment surrounding the semi-conductor network. As a further example, it is pointed out that resistor 75 of Figure 5 need not always be present, depending on the intrinsic characteristics and thermal properties of the semi-conducting device 11. Then, too, by properly proportioning resistances 74, 78, the requirement for source 72 may be eliminated, as long as the ordinate of the intersection 83 is greater than the ordinate of the valley point 89.

It will of course be understood that any other modifications may be made as required by the circumstances and demands upon the network, without departing from the principles of the invention. The appended claims are therefore intended to cover any such modifications, within the true scope and spirit of the invention.

What is claimed as new to be secured by Letters Patent of the United States is:

1. In combination, an electric device comprising a semi-conductor body of uniform conductivity type provided with spaced predominantly bilaterally conducting electrodes and a predominantly unilaterally conducting junction electrode adapted to inject carriers into the region affected by a potential difference between said bilaterally conducting electrodes, means for applying a first potential between said bilaterally conducting electrodes, means including an impedance for applying a second potential of the same sense as said first potential and lesser magnitude than said first potential between said junction electrode and one of said bilaterally conducting electrodes, and means jointly modifying the potential difference between said bilaterally conducting electrodes and the potential between said junction electrode and said one of said bilaterally conducting electrodes in response to a control impulse.

2. In combination, an electric device comprising a semi-conducting body of uniform conductivity type provided with spaced predominantly bilaterally conducting electrodes and a predominantly unilaterally conducting junction electrode disposed on said body in a region affected by an electric potential difference between said bilaterally conducting electrodes, a first source of electric potential, means including an electrically conductive winding for applying said first electric potential between said bilaterally conducting electrodes, resistive means connecting said junction electrode with the circuit including said bilaterally conducting electrodes, and signal responsive means for inducing a potential in said winding.

3. In combination, an electric device comprising a semi-conducting body of uniform conductivity type provided with spaced predominantly bilaterally conducting electrodes and a predominantly unilaterally conducting junction electrode disposed on said body in a region affected by an electric potential difference between said bilaterally conducting electrodes, means including an impedance for applying a first electric potential between said bilaterally conducting electrodes, resistive means connecting said junction electrode with the circuit including said bilaterally conductive electrodes, said resistive means biasing said junction at a potential intermediate that of said bilaterally conducting electrodes, and means for impressing a triggering signal across said impedance.

References Cited in the file of this patent

UNITED STATES PATENTS

| | | |
|---|---|---|
| 2,502,479 | Pearson et al. | Apr. 4, 1950 |
| 2,524,034 | Brattain | Oct. 3, 1950 |
| 2,585,078 | Barney | Feb. 12, 1952 |
| 2,600,500 | Haynes et al. | June 17, 1952 |
| 2,657,360 | Wallace | Oct. 27, 1953 |
| 2,681,993 | Shockley | June 22, 1954 |
| 2,769,926 | Lesk | Nov. 6, 1956 |